US011322284B2

(12) United States Patent
Ueki

(10) Patent No.: US 11,322,284 B2
(45) Date of Patent: May 3, 2022

(54) HIGH-FREQUENCY TRANSFORMER AND PHASE SHIFTER

(71) Applicant: Murata Manufacturing Co., Ltd., Nagaokakyo (JP)

(72) Inventor: Noriyuki Ueki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 651 days.

(21) Appl. No.: 16/159,804

(22) Filed: Oct. 15, 2018

(65) Prior Publication Data

US 2019/0051440 A1 Feb. 14, 2019

Related U.S. Application Data

(63) Continuation of application No. PCT/JP2017/024818, filed on Jul. 6, 2017.

(30) Foreign Application Priority Data

Jul. 15, 2016 (JP) .............................. JP2016-140653
Jul. 15, 2016 (JP) .............................. JP2016-140654

(51) Int. Cl.
*H01F 19/04* (2006.01)
*H01F 17/00* (2006.01)
(Continued)

(52) U.S. Cl.
CPC ............. *H01F 17/00* (2013.01); *H01F 19/04* (2013.01); *H01F 27/2804* (2013.01);
(Continued)

(58) Field of Classification Search
CPC .... H01F 17/00; H01F 17/006; H01F 17/0013; H01F 19/04; H01F 27/2804;
(Continued)

(56) References Cited

U.S. PATENT DOCUMENTS 5,436,601 A 7/1995 Mandai et al.
6,060,976 A 5/2000 Yamaguchi et al.
(Continued)

FOREIGN PATENT DOCUMENTS

JP 4-199804 A 7/1992
JP 6-215951 A 8/1994
(Continued)

OTHER PUBLICATIONS

Official Communication issued in International Patent Application No. PCT/JP2017/024818, dated Sep. 19, 2017.

*Primary Examiner* — Mang Tin Bik Lian
(74) *Attorney, Agent, or Firm* — Keating & Bennett, LLP

(57) ABSTRACT

A high-frequency transformer includes a primary coil and a secondary coil coupled to each other by magnetic field coupling and sharing a coil winding axis, a first terminal connected to a first end of the primary coil, a second terminal connected to a first end of the secondary coil, and a common terminal connected to a second end of the primary coil and a second end of the secondary coil. The primary and secondary coils are helical coils including loop conductor patterns, and the number of turns of a first loop conductor pattern closest to the second end of the primary coil is larger than an average number of turns of other loop conductor patterns included in the primary coil.

10 Claims, 9 Drawing Sheets

(51) Int. Cl.
*H03H 7/18* (2006.01)
*H01F 27/28* (2006.01)
*H03H 7/19* (2006.01)
*H03H 7/46* (2006.01)
*H03H 7/09* (2006.01)

(52) U.S. Cl.
CPC ....... *H03H 7/18* (2013.01); *H01F 2027/2809* (2013.01); *H03H 7/09* (2013.01); *H03H 7/19* (2013.01); *H03H 7/463* (2013.01)

(58) Field of Classification Search
CPC .... H01F 2027/2809; H03H 7/18; H03H 7/19; H03H 7/463; H03H 7/09
See application file for complete search history.

(56) References Cited

U.S. PATENT DOCUMENTS

| | | | |
|---|---|---|---|
| 6,198,374 | B1 | 3/2001 | Abel |
| 8,441,333 | B2 * | 5/2013 | Chiu ................. H01F 17/0013 336/200 |
| 2002/0157849 | A1 * | 10/2002 | Sakata ............... H01F 17/0013 174/546 |
| 2003/0134612 | A1 * | 7/2003 | Nakayama ......... H01F 17/0013 455/307 |
| 2004/0217915 | A1 * | 11/2004 | Imaizumi ................. H03H 7/38 343/860 |
| 2006/0261914 | A1 * | 11/2006 | Moriai ................. H03H 7/1708 333/185 |
| 2011/0025442 | A1 * | 2/2011 | Hsieh ................. H01F 17/0013 336/200 |
| 2012/0127049 | A1 * | 5/2012 | Kato ................... H01P 1/20345 343/749 |
| 2014/0292468 | A1 * | 10/2014 | Motomiya ........... H05K 3/1291 336/200 |
| 2016/0182003 | A1 | 6/2016 | Teshima et al. |
| 2017/0117868 | A1 | 4/2017 | Ishizuka et al. |
| 2017/0294261 | A1 * | 10/2017 | Sim ..................... H01F 27/2804 |
| 2017/0316869 | A1 * | 11/2017 | Omori ................. H01F 17/0013 |

FOREIGN PATENT DOCUMENTS

| | | | |
|---|---|---|---|
| JP | 6-216689 | A | 8/1994 |
| JP | 7-37728 | A | 2/1995 |
| JP | 7-38368 | A | 2/1995 |
| JP | 9-213530 | A | 8/1997 |
| JP | 2002-246231 | A | 8/2002 |
| JP | 2002-541658 | A | 12/2002 |
| JP | 2003-318045 | A | 11/2003 |
| JP | 2006-286934 | A | 10/2006 |
| JP | 4367487 | B2 | 11/2009 |
| JP | 2012-124470 | A | 6/2012 |
| WO | 2014/188739 | A1 | 11/2014 |
| WO | 2015/033632 | A1 | 3/2015 |
| WO | 2016/114181 | A1 | 7/2016 |

* cited by examiner

HIGH-FREQUENCY TRANSFORMER AND PHASE SHIFTER

CROSS REFERENCE TO RELATED APPLICATIONS

This application claims the benefit of priority to Japanese Patent Application No. 2016-140653 filed on Jul. 15, 2016, Japanese Patent Application No. 2016-140654 filed on Jul. 15, 2016 and is a Continuation Application of PCT Application No. PCT/JP2017/024818 filed on Jul. 6, 2017. The entire contents of these applications are hereby incorporated herein by reference.

BACKGROUND OF THE INVENTION

1. Field of the Invention

The present invention relates to a high-frequency transformer in which a primary coil and a secondary coil are coupled to each other with a high degree of coupling, and a phase shifter including the same.

2. Description of the Related Art

In accordance with miniaturization and thinning of electronic equipment, miniaturization/thinning of a built-in high-frequency transformer has been desired. However, in general, a coupling coefficient between a primary coil and a secondary coil in a high-frequency transformer is lowered as the size of the transformer becomes smaller. As a structure for obtaining a high coupling coefficient between a primary coil and a secondary coil in a high-frequency transformer, it is effective to use a laminated structure in which a primary-side coil and a secondary-side coil are wound on two winding axes and interleaved with each other (a bifilar winding structure), as disclosed in International Publication No. WO 2014/188739.

However, in the high-frequency transformer disclosed in International Publication No. WO 2014/188739, an area of a coil forming region is large, which is disadvantageous for miniaturization. Further, it is difficult to change the degree of freedom in design and the characteristics due to a complicated structure of the conductive patterns. For example, it is difficult to increase inductance (self-inductance and mutual inductance) of the primary coil and the secondary coil while increasing a coupling coefficient between the primary coil and the secondary coil.

In a case in which a high-frequency transformer is used as an impedance converter, the larger the coupling coefficient between the primary coil and the secondary coil of the high-frequency transformer is, the shorter the lengths of conductor patterns of the primary coil and the secondary coil is able to be made, thus reducing the loss. Further, in a case in which the high-frequency transformer is used as a phase shifter, as the coupling coefficient between the primary coil and the secondary coil increases, an amount of phase shift closer to 180 degrees is obtained.

In addition, in the high-frequency transformer disclosed in Japanese Unexamined Patent Application Publication No. 3-62908, since a distribution range of loop conductor patterns in the lamination direction is widened for each of the primary coil and the secondary coil, self-inductance of each of the primary coil and the secondary coil cannot be increased. Further, since a potential difference generated between the layers of the loop conductor patterns of the primary coil and the secondary coil is large, parasitic capacitance between the primary coil and the secondary coil is large.

SUMMARY OF THE INVENTION

Preferred embodiments of the present invention provide high-frequency transformers each having a predetermined high inductance while obtaining a predetermined high coupling coefficient between a primary coil and a secondary coil, and phase shifters including the high-frequency transformers.

Preferred embodiments of the present invention further provide high-frequency transformers in each of which a primary coil and a secondary coil are coupled with a predetermined high coupling coefficient while reducing or preventing parasitic capacitance, and phase shifters including the high-frequency transformers.

A high-frequency transformer according to a preferred embodiment of the present invention includes a primary coil and a secondary coil coupled to each other by magnetic field coupling and having the same or substantially the same coil winding axis; a first terminal connected to a first end of the primary coil; a second terminal connected to a first end of the secondary coil; and a common terminal connected to both of a second end of the primary coil and a second end of the secondary coil, wherein each of the primary coil and the secondary coil is a helical coil including a plurality of loop conductor patterns provided on a plurality of layers, the primary coil includes a first loop conductor pattern closest to the second end of the primary coil among the plurality of loop conductor patterns defining the primary coil, the secondary coil includes a second loop conductor pattern closest to the second end of the secondary coil among the plurality of loop conductor patterns defining the secondary coil, and, the number of turns of the first loop conductor pattern is larger than an average number of turns of other loop conductor patterns included in the primary coil.

According to the above-described structure, since the number of turns of the first loop conductor pattern, which is a loop conductor pattern with high current density in the primary coil, is large, self-inductance of the primary coil is able to be increased. Further, the distribution range in the lamination direction of the loop conductor patterns is able to be shortened for each of the primary coil and the secondary coil, so that the mutual inductance between the primary coil and the secondary coil is increased. Furthermore, of the loop conductor patterns in the primary coil and the secondary coil, the loop conductor patterns with high current density are close to each other, and the number of turns of the portion of high current density is large, thus obtaining a high coupling coefficient.

It is preferable that the number of turns of the second loop conductor pattern be larger than an average number of turns of other loop conductor patterns included in the secondary coil. Thus, since the number of turns of the second loop conductor pattern, which is a loop conductor pattern with high current density in the secondary coil, is large, self-inductance of the secondary coil is increased. Further, since the first loop conductor pattern with high current density and the second loop conductor pattern with high current density are close to each other, and the number of turns of the portion of high current density is large, a high coupling coefficient is obtained.

It is preferable that the number of turns of the first loop conductor pattern are equal or substantially equal to the number of turns of the second loop conductor pattern. As a result, the coupling coefficient between the first loop conductor pattern with high current density and the second loop conductor pattern with high current density is effectively increased, so that the coupling coefficient between the primary coil and the secondary coil is further increased.

It is preferable that a line width of the first loop conductor pattern is larger than an average line width of other loop conductor patterns included in the primary coil. This reduces conductor loss in the first loop conductor pattern with high current density, and reduces direct-current resistance (DCR) of the primary coil.

It is preferable that a line width of the second loop conductor pattern is larger than an average line width of other loop conductor patterns included in the secondary coil. This reduces conductor loss in the second loop conductor pattern with high current density, and reduces direct-current resistance (DCR) of the secondary coil.

It is preferable that each loop conductor pattern located in each layer of the plurality of loop conductor patterns is provided on a nonmagnetic base substrate. With this structure, the loop conductor patters are not harmfully affected by frequency characteristics of magnetic permeability of a magnetic material. Further, no magnetic body loss due to the magnetic material is generated.

In a plan view along the coil winding axis, it is preferable that circling positions of the plurality of loop conductor patterns of the primary coil and circling positions of the plurality of loop conductor patterns of the secondary coil overlap each other. This effectively increases the coupling coefficient between the primary and secondary coils.

It is preferable that an interlayer distance between the first loop conductor pattern and the second loop conductor pattern is shorter than an interlayer distance between other loop conductor patterns included in the primary coil, or than an interlayer distance between other loop conductor patterns included in the secondary coil. As a result, the first loop conductor pattern with high current density and the second loop conductor pattern with high current density are closer to each other, so that a high coupling coefficient is effectively obtained.

It is preferable that the inductance of the primary coil and the inductance of the secondary coil are equal or substantially equal. This makes it more suitable for the high-frequency transformer to be used as a phase shifter while maintaining a constant impedance conversion ratio.

A high-frequency transformer according to a preferred embodiment of the present invention includes a primary coil and a secondary coil coupled to each other by magnetic field coupling and having the same or substantially the same coil winding axis; a first terminal connected to a first end of the primary coil; a second terminal connected to a first end of the secondary coil; and a common terminal connected to both of a second end of the primary coil and a second end of the secondary coil, wherein each of the primary coil and the secondary coil is a helical coil including a plurality of loop conductor patterns provided on a plurality of layers, among the plurality of loop conductor patterns defining the primary coil, a first loop conductor pattern closest to the second end of the primary coil is located between a layer of a second loop conductor pattern closest to the second end of the secondary coil and a layer of the loop conductor pattern adjacent to the second loop conductor pattern among the plurality of loop conductor patterns constituting the secondary coil, and among the plurality of loop conductor patterns defining the secondary coil, the second loop conductor pattern closest to the second end of the secondary coil is located between a layer of the first loop conductor pattern and a layer of the loop conductor pattern adjacent to the first loop conductor patter among the plurality of loop conductor patterns of the primary coil.

With this structure, in the primary coil, the second loop conductor pattern is interposed between the layers of the first loop conductor pattern closest to the second end of the primary coil and the loop conductor pattern adjacent to the first loop conductor pattern so that the first loop conductor pattern and the loop conductor pattern adjacent to the first loop conductor pattern are distanced from one another in the lamination direction, such that parasitic capacitance of the primary coil is reduced or prevented. Similarly, in the secondary coil, the first loop conductor pattern is interposed between the layers of the second loop conductor pattern closest to the second end of the secondary coil and the loop conductor pattern adjacent to the second loop conductor pattern so that the second loop conductor pattern and the loop conductor pattern adjacent to the second loop conductor pattern are distanced from one another in the lamination direction, such that parasitic capacitance of the secondary coil is also reduced or prevented. In addition, in the primary coil and the secondary coil, the loop conductor patterns with the strongest current intensity are close to each other, and the loop conductor pattern with the strongest current intensity is interposed between the layers of the loop conductor pattern with the strongest current intensity of the partner coil and the loop conductor pattern with the second strongest current intensity of the partner coil, thus making it possible to effectively increase the coupling coefficient between the primary coil and the secondary coil. Furthermore, the first loop conductor pattern and its adjacent pattern, which are the layers on a side closer to a common potential (ground potential) of the primary coil, and the second loop conductor pattern and its adjacent pattern, which are the layers on a side closer to a common potential (ground potential) of the secondary coil, are disposed such that the layers of the primary coil and the layers of the secondary coil are alternately arranged in the lamination direction. With this structure, parasitic capacitance generated between the primary coil and the secondary coil is reduced or prevented.

In a high-frequency transformer according to a preferred embodiment of the present invention, it is preferable that the number of turns of the first loop conductor pattern is larger than an average number of turns of other loop conductor patterns included in the primary coil. With this structure, of the loop conductor patterns of the primary coil and the secondary coil, the loop conductor patterns with high current intensity are close to each other, and the number of turns of the portion of high current intensity is large, thus obtaining a high coupling coefficient.

In a high-frequency transformer according to a preferred embodiment of the present invention, it is preferable that the number of turns of the second loop conductor pattern is larger than an average number of turns of other loop conductor patterns included in the secondary coil. With this structure, of the loop conductor patterns of the primary coil and the secondary coil, the loop conductor patterns with strong current intensity are close to each other, and the number of turns of the portion of high current intensity is large, thus obtaining a high coupling coefficient.

It is preferable that the number of turns of the first loop conductor pattern and the number of turns of the second loop conductor pattern are equal or substantially equal. As a result, a coupling coefficient between the first loop conductor pattern and second loop conductor pattern with strong current intensity is effectively increased, and consequently the coupling coefficient between the primary coil and the secondary coil is further increased.

In a high-frequency transformer according to a preferred embodiment of the present invention, it is preferable that each loop conductor pattern located in each layer of the plurality of loop conductor patterns is provided on a non-magnetic base substrate. With this structure, loop conductor patterns are not harmfully affected by frequency characteristics of magnetic permeability of the magnetic material. Further, no magnetic body loss due to the magnetic material occurs.

In a high-frequency transformer according to a preferred embodiment of the present invention, it is preferable that, in a plan view along the coil winding axis, circling positions of the plurality of loop conductor patterns of the primary coil and circling positions of the plurality of loop conductor patterns of the secondary coil overlap each other. This effectively increases the coupling coefficient between the primary and secondary coils.

In a high-frequency transformer according to a preferred embodiment of the present invention, it is preferable that the inductance of the primary coil and the inductance of the secondary coil are equal or substantially equal. This makes it more suitable for the high-frequency transformer to be used as a phase shifter while keeping the impedance conversion ratio constant.

A phase shifter according to a preferred embodiment of the present invention includes a high-frequency transformer according to a preferred embodiment of the present invention, wherein the first terminal and the common terminal define a first input-output port, and the second terminal and the common terminal define a second input-output port.

According to preferred embodiments of the present invention, high-frequency transformers each having a predetermined high inductance while obtaining a predetermined high coupling coefficient between a primary coil and a secondary coil, and phase shifters including the high-frequency transformers are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
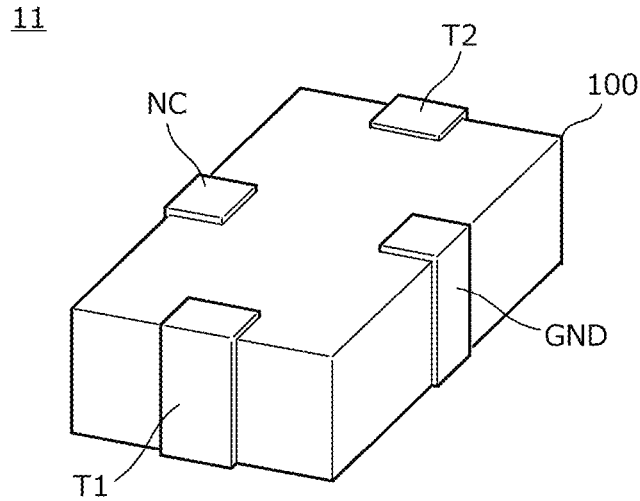
FIG. 1 is an external perspective view of a high-frequency transformer 11 according to a first preferred embodiment of the present invention.

Hereinafter, a plurality of preferred embodiments of the present invention will be described with reference to the drawings. In the drawings, the same reference signs denote the same elements. In view of the ease of explanation and understanding of the essential points, preferred embodiments are described separately, but partial replacement or combination of the configurations described in different preferred embodiments are possible. In a second preferred embodiment and subsequent preferred embodiments, the same elements as those in a first preferred embodiment will not be described, and only the points different therefrom will be described.

First Preferred Embodiment

In a first preferred embodiment of the present invention, an example of a high-frequency transformer and a phase shifter including the high-frequency transformer will be described.

Figure 2:
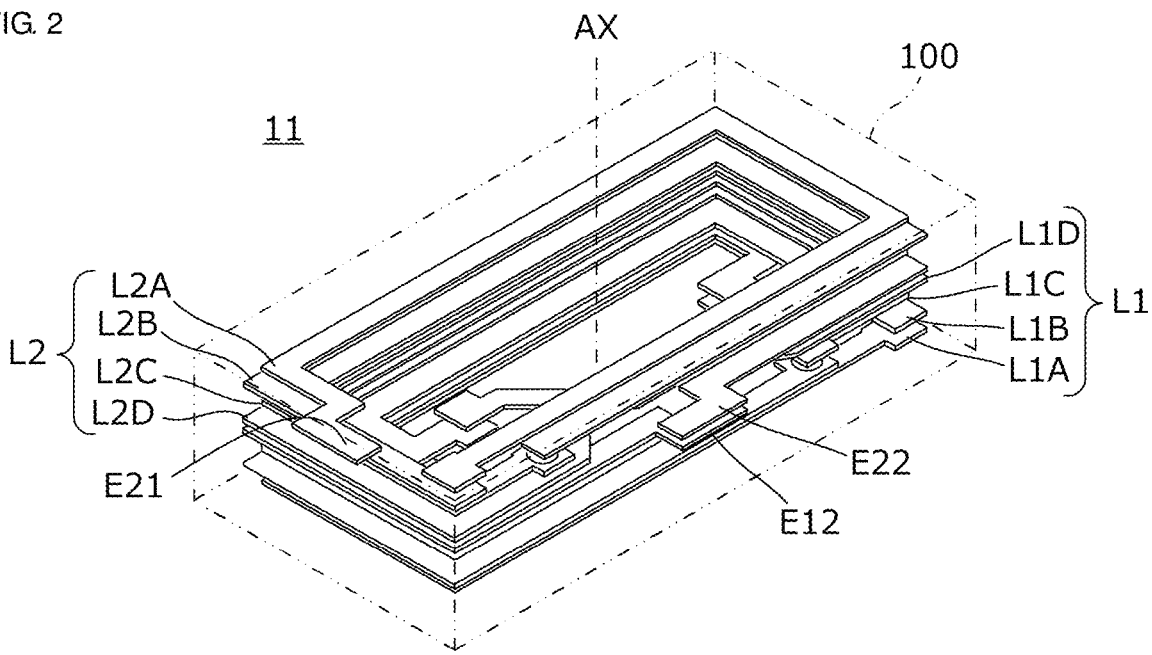
FIG. 2 is a perspective view illustrating shapes and arrangement of a plurality of loop conductor patterns inside the high-frequency transformer 11 according to the first preferred embodiment of the present invention.
Figure 3:
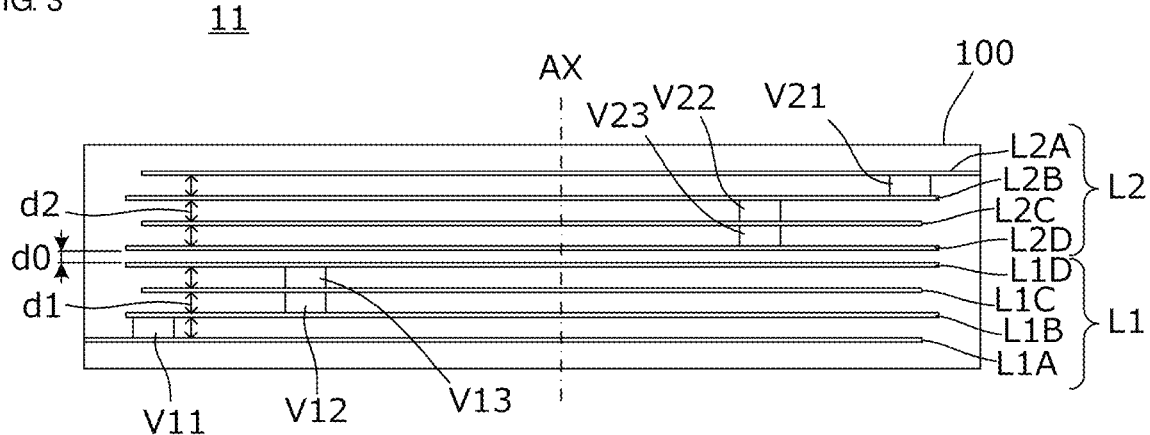
FIG. 3 is a front view of the high-frequency transformer according to the first preferred embodiment of the present invention.
Figure 4:
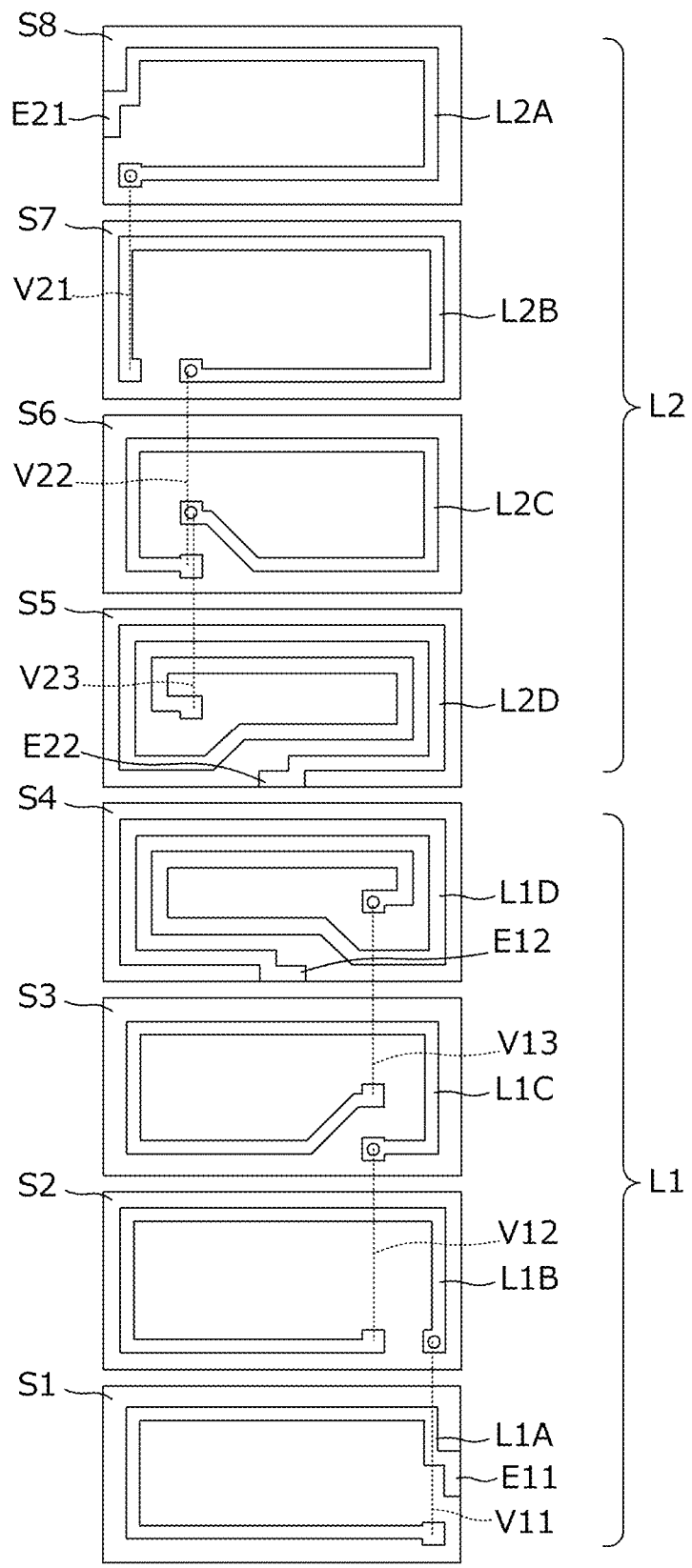
FIG. 4 is an exploded plan view of the high-frequency transformer 11 according to the first preferred embodiment of the present invention illustrating conductor patterns provided on each base substrate.
Figure 5:
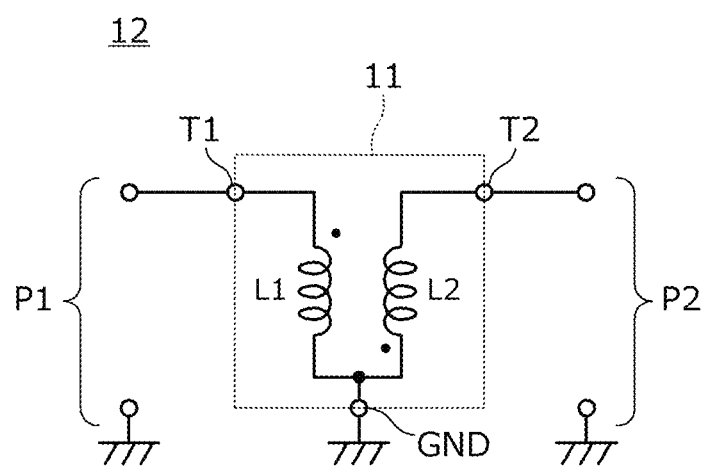
FIG. 5 is a circuit diagram of the high-frequency transformer 11 and a phase shifter 12 according to the first preferred embodiment of the present invention.

FIG. 1 is an external perspective view of the high-frequency transformer 11 according to the first preferred embodiment, and FIG. 2 is a perspective view illustrating shapes and arrangement of a plurality of loop conductor patterns inside the high-frequency transformer 11. FIG. 3 is a front view of the high-frequency transformer 11. In FIG. 2 and FIG. 3, base substrates are seen through. FIG. 4 is an exploded plan view of the high-frequency transformer 11 illustrating conductor patterns provided on the base substrates. FIG. 5 is a circuit diagram of the high-frequency transformer 11 and the phase shifter 12.

As illustrated in FIG. 1, the high-frequency transformer 11 includes a multilayer body 100 including a plurality of base substrates on which the loop conductor patterns are provided. On an outer surface of the multilayer body 100, a first terminal T1, a second terminal T2, a ground terminal GND, and an unused terminal NC are provided.

As illustrated in FIG. 5, the high-frequency transformer 11 includes a primary coil L1 and a secondary coil L2 to be coupled to each other by magnetic field coupling. The primary coil L1 and the secondary coil L2 have the same or substantially the same coil winding axis AX, as illustrated in FIGS. 2 and 3.

In a plan view along the coil winding axis AX, circling positions of the plurality of loop conductor patterns of the primary coil L1 and circling positions of the plurality of loop conductor patterns of the secondary coil L2 overlap each other.

As illustrated in FIG. 1, the first terminal T1 connected to a first end of the primary coil L1, the second terminal T2 connected to a first end of the secondary coil L2, and the ground terminal GND connected to both a second end of the primary coil L1 and a second end of the secondary coil L2 are provided. The ground terminal GND is an example of a "common terminal". The phase shifter 12 is configured such that the first terminal T1 and the ground terminal GND of the high-frequency transformer 11 define a first input-output port P1, and the second terminal T2 and the ground terminal GND define a second input-output port P2.

As illustrated in FIG. 4, loop conductor patterns L1A, L1B, L1C, and L1D are provided on base substrates S1, S2, S3, and S4, respectively. Further, loop conductor patterns L2D, L2C, L2B, and L2A are provided on base substrates S5, S6, S7, and S8, respectively.

A first end of the loop conductor pattern L1A defines a first end E11 of the primary coil L1 (the first terminal T1 in the circuit diagram illustrated in FIG. 5). A second end of the loop conductor pattern L1A and a first end of the loop conductor pattern L1B are interlayer-connected with a via conductor V11. A second end of the loop conductor pattern L1B and a first end of the loop conductor pattern L1C are interlayer-connected with a via conductor V12. A second end of the loop conductor pattern L1C and a first end of the loop conductor pattern L1D are interlayer-connected with a via conductor V13. A second end of the loop conductor pattern L1D defines a second end E12 of the primary coil L1.

A first end of the loop conductor pattern L2A defines a first end E21 of the secondary coil L2. A second end of the loop conductor pattern L2A and a first end of the loop conductor pattern L2B are interlayer-connected with a via conductor V21. A second end of the loop conductor pattern L2B and a first end of the loop conductor pattern L2C are interlayer-connected with a via conductor V22. A second end of the loop conductor pattern L2C and a first end of the loop conductor pattern L2D are interlayer-connected with a via conductor V23. A second end of the loop conductor pattern L2D defines a second end E22 of the secondary coil L2 (the second terminal T2 in the circuit diagram illustrated in FIG. 5).

Of the plurality of loop conductor patterns defining the primary coil L1, the loop conductor pattern L1D closest to the second end E12 corresponds to a "first loop conductor pattern". Of the plurality of loop conductor patterns defining the above-described secondary coil L2, the loop conductor pattern L2D closest to the second end E22 corresponds to a "second loop conductor pattern".

Each of the loop conductor patterns L1A, L1B, and L1C includes about 1 turn, and the first loop conductor pattern L1D includes about 2 turns. In addition, each of the loop conductor patterns L2A, L2B, and L2C includes about 1 turn, and the second loop conductor pattern L2D includes about 2 turns. That is, among the plurality of loop conductor patterns defining the primary coil L1, the number of turns of the first loop conductor pattern L1D closest to the second end E12 of the primary coil L1 is larger than the average number of turns of other loop conductor patterns (L1A, L1B and L1C) included in the primary coil L1. Similarly, among the plurality of loop conductor patterns defining the secondary coil L2, the number of turns of the second loop conductor pattern L2D closest to the second end E22 of the secondary coil L2 is larger than the average number of turns of other loop conductor patterns (L2A, L2B and L2C) included in the secondary coil L2.

As described above, the primary coil L1 and the secondary coil L2 are preferably rectangular or substantially rectangular helical coils each including a plurality of loop conductor patterns provided on a plurality of layers.

Figure 13:
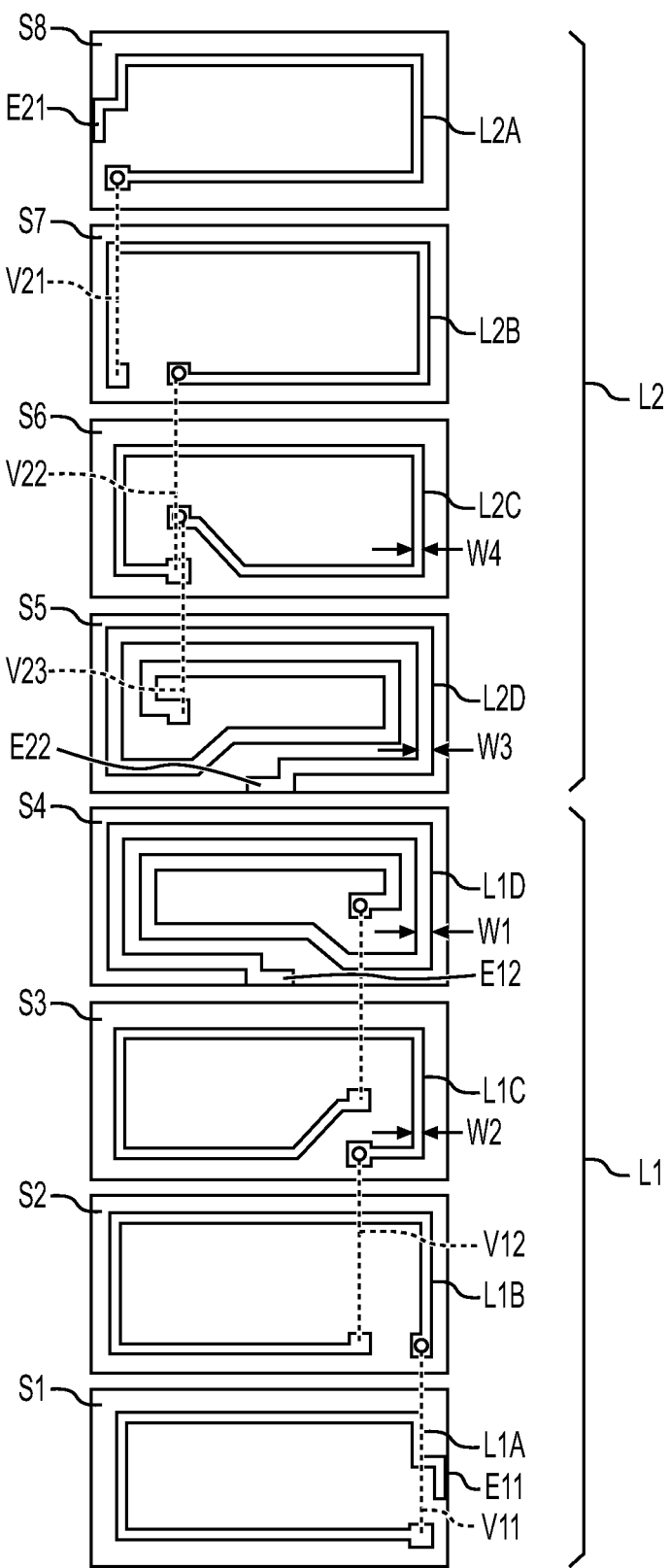
FIG. 13 is an exploded plan view of a high-frequency transformer according to a preferred embodiment of the present invention illustrating conductor patterns provided on each base substrate and having line widths that are different from each other.

As illustrated in FIG. 13, the line width W1 of the first loop conductor pattern L1D is larger than the average line width W2 of other loop conductor patterns L1A, L1B, and L1C included in the primary coil L1. Similarly, the line width W3 of the second loop conductor pattern L2D is larger than the average line width W4 of other loop conductor patterns L2A, L2B, and L2C included in the secondary coil L2.

In the present preferred embodiment, the lamination order of the plurality of loop conductor patterns defining the primary coil L1 and the lamination order of the plurality of loop conductor patterns defining the secondary coil L2 are opposite to each other in the lamination direction, and the loop conductor patterns of each of the corresponding layers are mirror-symmetrical. Further, the winding direction from the first end E11 to the second end E12 of the primary coil L1 is the same as the winding direction from the second end E22 to the first end E21 of the secondary coil L2. Therefore, the inductance of the primary coil L1 is equal or substantially equal to the inductance of the secondary coil L2.

A non-limiting example of a manufacturing method for the high-frequency transformer 11 according to the present preferred embodiment is described below.

First, metal foil (e.g., copper foil) is laminated on a main surface on one side of each of thermoplastic-resin base substrates S1, S2, S3, S4, S5, S6, S7, and S8 made of liquid crystal polymer or other suitable material in a state of a collective board, and the metal foil is patterned by photolithography to form the loop conductive patterns L1A, L1B, L1C, L1D, L2D, L2C, L2B, L2A.

Further, via conductors are formed in the resin base substrates S2, S3, S4, S6, S7, and S8 in the collective board state. Each of the via conductors is provided in the following manner: a through-hole is provided using a laser or other suitable device. Thereafter, a conductive paste including at least one of copper, silver, tin, and other suitable material is disposed, and the conductive paste is cured in a heating and pressurizing process to be performed later.

The resin base substrates S1, S2, S3, S4, S5, S6, S7, and S8 are laminated, and are heated and pressurized so that the conductive paste is solidified. Further, the resin base substrates S1, S2, S3, S4, S5, S6, S7, and S8 are pressure-bonded to form a multilayer body in the collective board state.

Next, the multilayer body in the collective board state is divided to obtain each individual multilayer body 100.

Thereafter, the first terminal T1, the second terminal T2, the ground terminal GND, and the unused terminal NC are formed on a first main surface, a second main surface, and four side surfaces of the multilayer body 100.

Figure 6:
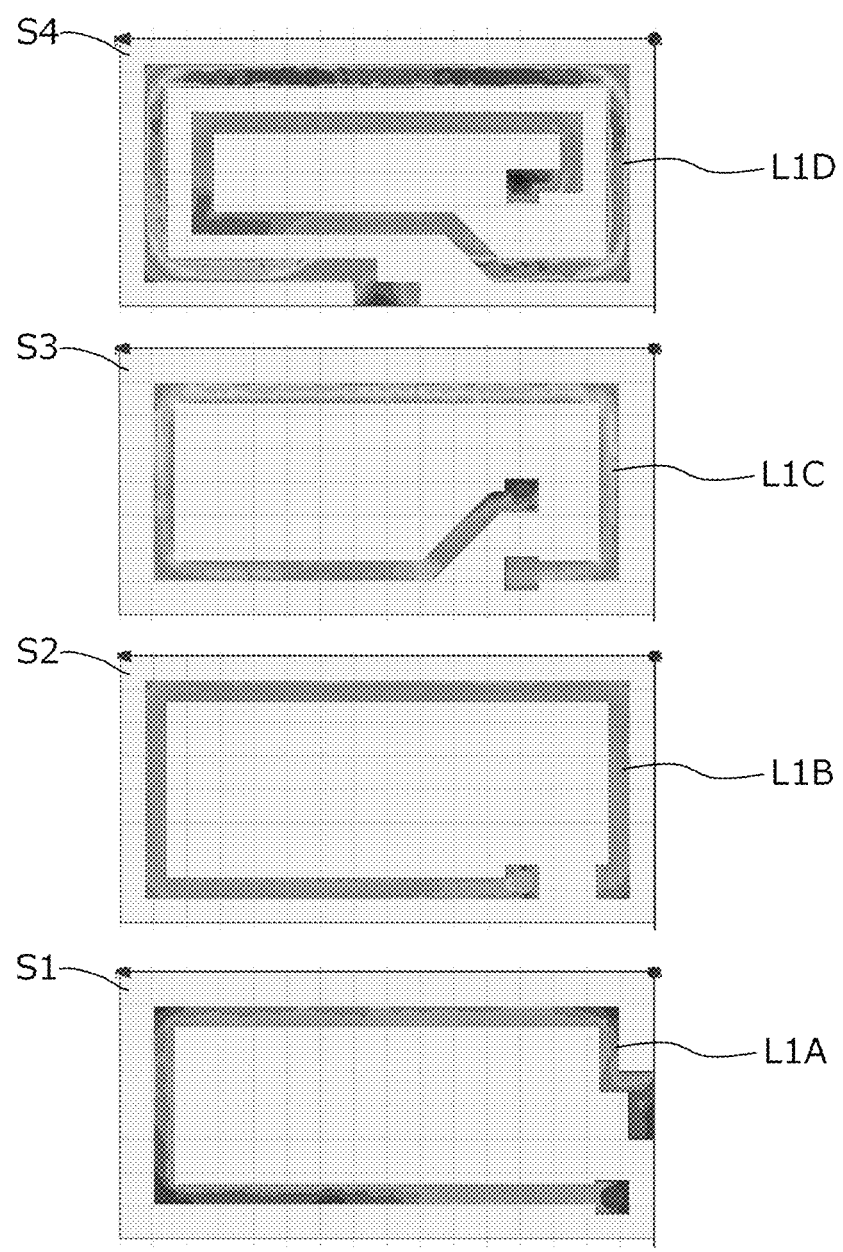
FIG. 6 is a diagram (contour diagram) illustrating current densities of loop conductor patterns L1A, L1B, L1C, and L1D in different shades.
Figure 7:
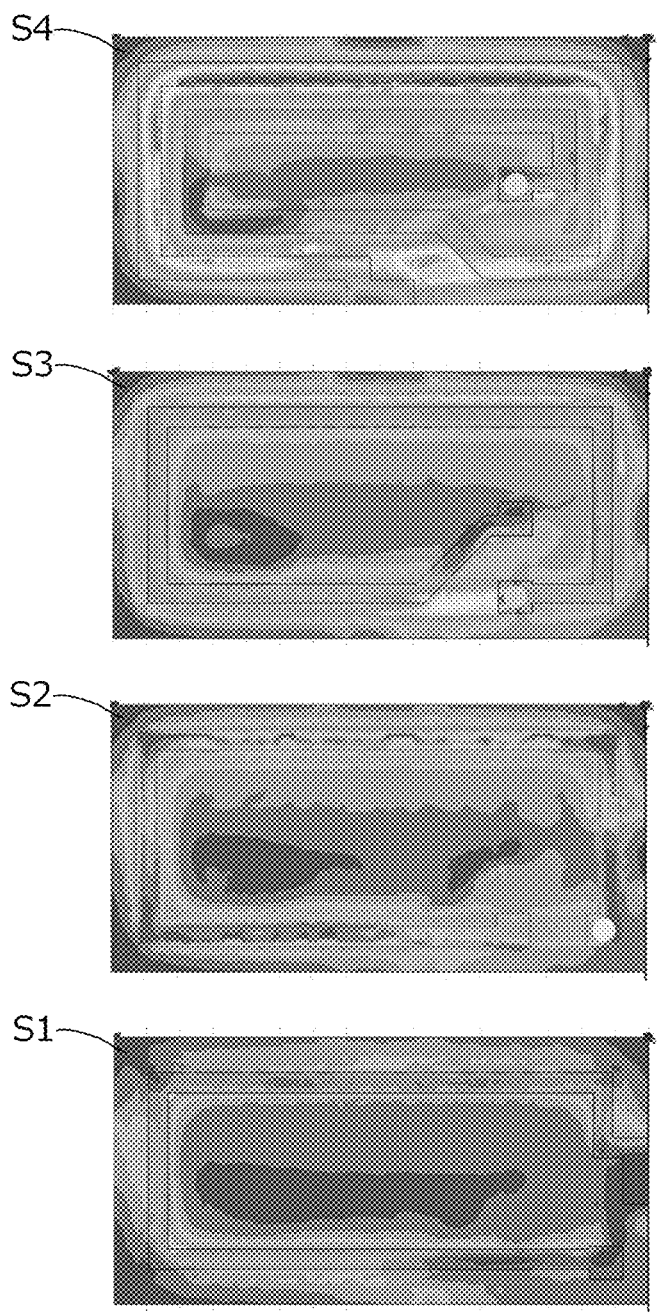
FIG. 7 is a diagram (contour diagram) illustrating magnetic field intensity of each layer of the loop conductor patterns L1A, L1B, L1C, and L1D in the different shades.

FIG. 6 is a diagram (contour diagram) illustrating current densities of the loop conductor patterns L1A, L1B, L1C, and L1D in the different shades. FIG. 7 is a diagram (contour diagram) illustrating magnetic field intensity in each of the layers of the loop conductor patterns L1A, L1B, L1C, and L1D in the different shades.

As illustrated in FIGS. 6 and 7, among the plurality of loop conductor patterns defining the primary coil L1, the magnetic field intensity by the first loop conductor pattern L1D closest to the second end E12 of the primary coil L1 is the strongest. Similarly, among the plurality of loop conductor patterns defining the secondary coil L2, the magnetic field intensity by the second loop conductor pattern L2D closest to the second end E22 of the secondary coil L2 is the strongest.

According to the present preferred embodiment, the following advantageous effects are obtained.

Since the number of turns of the first loop conductor pattern L1D is relatively large, self-inductance of the primary coil is increased. Further, in comparison with the bifilar winding structure, the distribution range in the lamination direction of the loop conductor patterns is able to be shortened for each of the primary coil and the secondary coil, thus making it possible to increase mutual inductance between the primary coil and the secondary coil. Furthermore, of the loop conductor patterns in the primary coil and the secondary coil, the loop conductor patterns with high current density are close to each other, and the number of turns of the portion of high current density is large, thus obtaining a high coupling coefficient.

Since the number of turns of the second loop conductor pattern L2D is relatively large, self-inductance of the secondary coil is increased. Further, since the first loop conductor pattern with high current density and the second loop conductor pattern with high current density are close to each other, and the number of turns of the portion of high current density is large, a high coupling coefficient is obtained.

Since the number of turns of the first loop conductor pattern L1D and the number of turns of the second loop conductor pattern L2D are equal or substantially equal to each other, the coupling coefficient between the first loop pattern L1D with high current density and the second loop conductor pattern L2D with high current density is effectively increased, and the coupling coefficient between the primary coil and the secondary coil is further increased.

Since the line width of the first loop conductor pattern L1D is larger than the average line width of other loop conductor patterns included in the primary coil L1, the conductor loss in the first loop conductor pattern L1D with high current density is reduced, and direct-current resistance (DCR) of the primary coil L1 is reduced.

Since the line width of the second loop conductor pattern L2D is larger than the average line width of other loop conductor patterns included in the secondary coil L2, the conductor loss in the second loop conductor pattern L2D with high current density is reduced, and the direct-current resistance (DCR) of the secondary coil L2 is reduced.

Since the loop conductor patterns located in the respective layers of the plurality of loop conductor patterns are provided on the corresponding nonmagnetic base substrates (S1 to S8), they are not harmfully affected by frequency characteristics of the magnetic permeability of the magnetic material. Further, no magnetic body loss due to the magnetic material is generated.

In a plan view along the coil winding axis, since the circling positions of the plurality of loop conductor patterns of the primary coil L1 and the circling positions of the plurality of loop conductor patterns of the secondary coil L2 overlap each other, a high coupling coefficient between the primary coil L1 and the secondary coil L2 is obtained.

Since the interlayer distance between the first loop conductor pattern L1D and the second loop conductor pattern L2D is shorter than the interlayer distance with regard to other loop conductor patterns L1A, L1B and L1C included in the primary coil L1, or than the interlayer distance with regard to other loop conductor patterns L2A, L2B and L2C included in the secondary coil L2, the first loop conductor pattern L1D with high current density and the loop conductor pattern L2D with high current density are closer to each other so that a high coupling coefficient between the primary coil L1 and the secondary coil L2 is obtained.

Since the inductance of the primary coil L1 and the inductance of the secondary coil L2 are equal or substantially equal, the high-frequency transformer is more suitable to be used as a phase shifter while maintaining a constant impedance conversion ratio.

In the preferred embodiment described above, among the numbers of turns of the plurality of loop conductor patterns defining the primary coil L1, the number of turns of the first loop conductor pattern L1D closest to the second end E12 of the primary coil L1 is preferably about two, for example, and the number of turns of each of other loop conductor patterns L1A, L1B, and L1C included in the primary coil L1 is preferably about one, for example. However, the number of turns of each of other loop conductor patterns L1A, LB, and L1C may be different from each other. For example, the number of turns of the loop conductor pattern L1C adjacent to the first loop conductor pattern L1D may be one or more than one. Similarly, the number of turns of the loop conductor pattern L2C adjacent to the second loop conductor pattern L2D may be one or more than one. Note that, however, in order to increase the self-inductance of the primary coil or to increase the coupling coefficient between the primary coil L1 and the secondary coil L2, it is preferable that the number of turns of the first loop conductor pattern L1D closest to the second end E12 of the primary coil L1 be largest in any of the numbers of turns of other loop conductor patterns L1A, L1B, and L1C included in the primary coil L1. Similarly, it is preferable that the number of turns of the second loop conductor pattern L2D closest to the second end E22 of the secondary coil L2 be largest in any of the numbers of turns of other loop conductor patterns L2A, L2B, and L2C included in the secondary coil L2.

Meanwhile, in the preferred embodiment described above, a case is exemplified in which the number of turns of the first loop conductor pattern L1D is larger than the average number of turns of other loop conductor patterns and the number of turns of the second loop conductor pattern L2D is larger than the average number of turns of other loop conductor patterns. However, it may be configured so that only one of the primary coil or the secondary coil satisfies the above-described condition.

Moreover, in the preferred embodiment described above, a case in which the number of turns of the first loop conductor pattern L1D is equal to the number of turns of the second loop conductor pattern L2D is exemplified. Although it is preferable that the two loop conductor patterns have the same number of turns, it is sufficient that the two loop conductor patterns have substantially the same number of turns. Further, the numbers of turns of the two loop conductor patterns may be different from each other.

Furthermore, in the preferred embodiment described above, a case in which the line width of the first loop conductor pattern L1D is larger than the average line width of other loop conductor patterns, and the line width of the second loop conductor pattern L2D is larger than the average line width of other loop conductor patterns is exemplified. It may be configured so that any one of the first loop conductor pattern L1D or the second loop conductor pattern L2D satisfies the above-described condition.

In addition, in the preferred embodiment described above, a case in which the circling positions of the plurality of loop conductor patterns of the primary coil L1 and the circling positions of the plurality of loop conductor patterns of the secondary coil L2 overlap each other over the entire or substantially entire circumference in a plan view along the coil winding axis AX is exemplified. However, the circling positions of the plurality of loop conductor patterns of the primary coil L1 and the circling positions of the plurality of loop conductor patterns of the secondary coil L2 may be shifted within an allowable range of a decrease in the coupling coefficient between the primary coil L1 and the secondary coil L2.

Further, in the above-described preferred embodiment, the interlayer distance between the first loop conductor pattern L1D and the second loop conductor pattern L2D is shorter than the interlayer distance with regard to other loop conductor patterns included in the primary coil L1, or than the interlayer distance with regard to other loop conductor patterns included in the secondary coil L2. However, the interlayer distance between the first loop conductor pattern L1D and the second loop conductor pattern L2D may be equal or substantially equal to the interlayer distance with regard to other loop conductor patterns.

In addition, in the above-described preferred embodiment, a case in which the loop conductor pattern of each layer is mirror-symmetrical with the corresponding loop conductor pattern is exemplified, however the loop conductor pattern of each layer may not be mirror-symmetrical. Further, the inductance of the primary coil L1 may be different from the inductance of the secondary coil L2.

Second Preferred Embodiment

Figure 8:
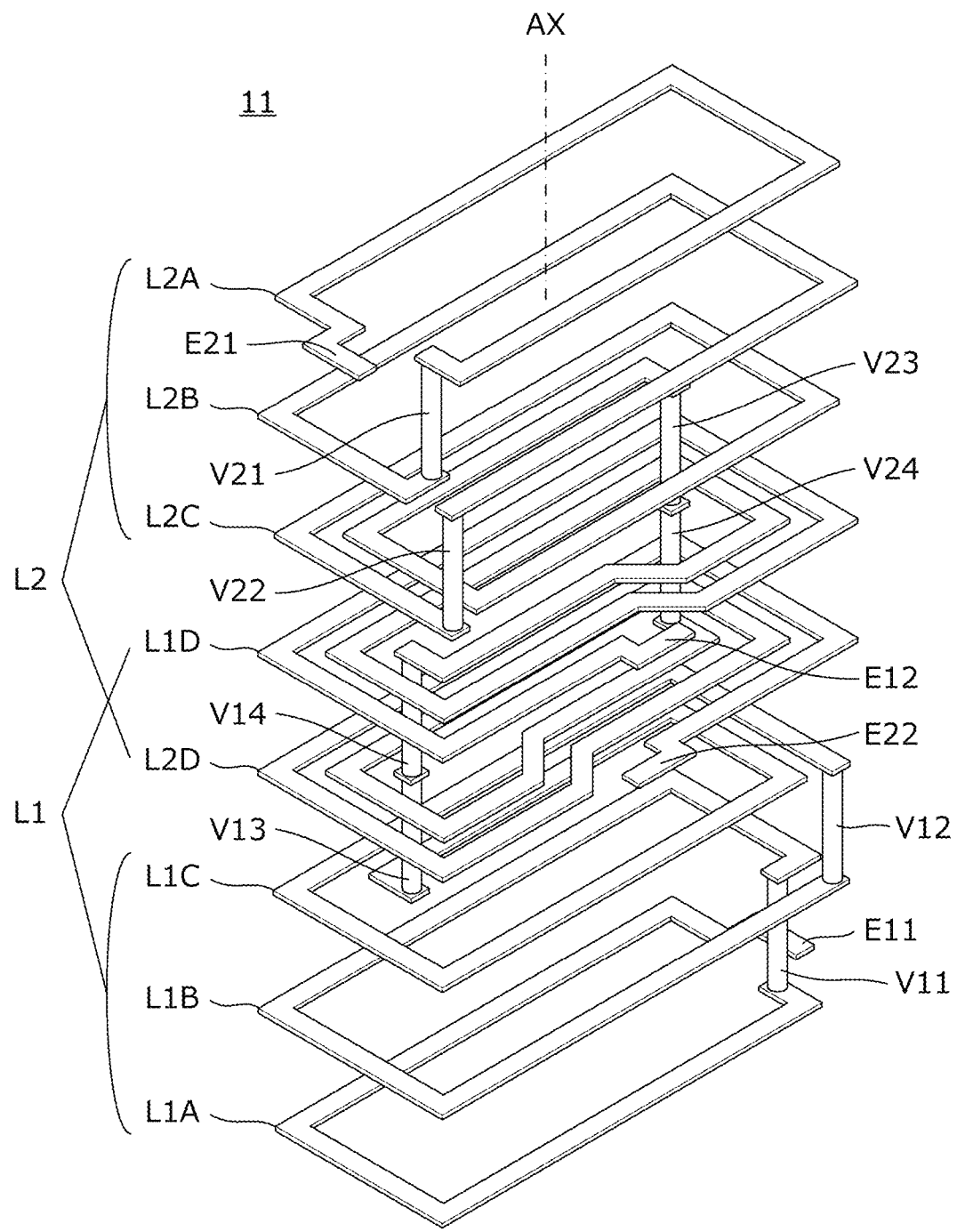
FIG. 8 is a perspective view illustrating shapes and configurations of a plurality of loop conductor patterns inside a high-frequency transformer 11 according to a second preferred embodiment of the present invention.
Figure 9:
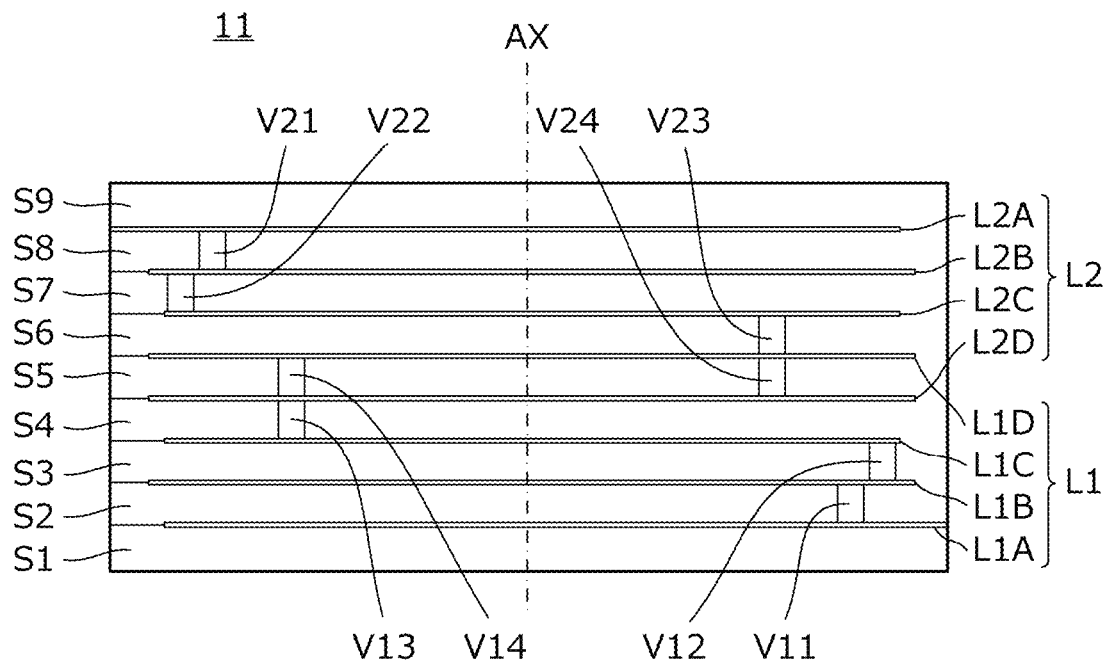
FIG. 9 is a front view of the high-frequency transformer 11 according to the second preferred embodiment of the present invention.
Figure 10:
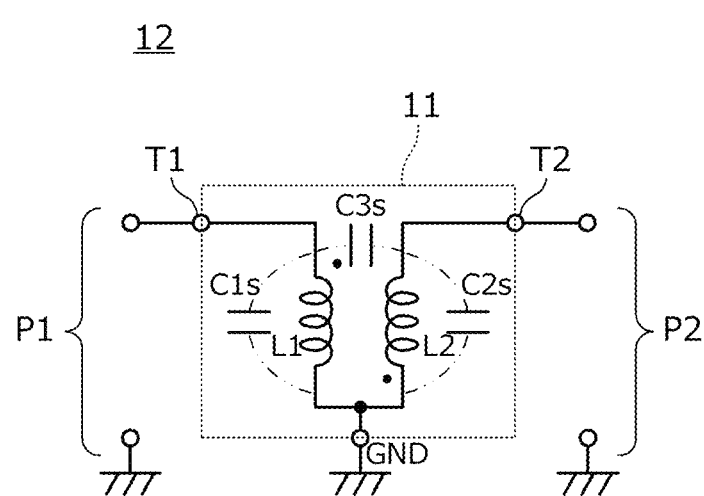
FIG. 10 is a circuit diagram of the high-frequency transformer 11 and the phase shifter 12 according to the second preferred embodiment of the present invention.

FIG. 8 is a perspective view illustrating shapes and configurations of a plurality of loop conductor patterns inside a high-frequency transformer 11 according to a second preferred embodiment of the present invention. The external appearance of the high-frequency transformer 11 is the same or substantially the same as that of the transformer illustrated in FIG. 1 in the first preferred embodiment. FIG. 9 is a front view of the high-frequency transformer 11. In FIG. 8 and FIG. 9, base substrates are seen through. FIG. 10 is a circuit diagram of the high-frequency transformer 11 and the phase shifter 12.

As illustrated in FIG. 8, the high-frequency transformer 11 includes a multilayer body 100 including a plurality of base substrates on which the loop conductor patterns are provided. On the outer surface of the multilayer body 100, a first terminal T1, a second terminal T2, a ground terminal GND, and an unused terminal NC are provided (see FIG. 1).

As illustrated in FIG. 10, the high-frequency transformer 11 includes a primary coil L1 and a secondary coil L2 to be coupled to each other by magnetic field coupling. In FIG. 10, capacitance C1s represents parasitic capacitance generated in the primary coil L1, capacitance C2s represents parasitic capacitance generated in the secondary coil L2, and capacitance C3s represents parasitic capacitance generated between the primary coil L1 and the secondary coil L2.

As illustrated in FIGS. 8 and 9, the primary coil L1 and the secondary coil L2 have the same or substantially the same coil winding axis AX. In a plan view along the coil winding axis AX, circling positions of the plurality of loop conductor patterns of the primary coil L1 and circling positions of the plurality of loop conductor patterns of the secondary coil L2 overlap each other.

As illustrated in FIG. 1, the first terminal T1 connected to a first end of the primary coil L1, the second terminal T2 connected to a first end of the secondary coil L2, and the ground terminal GND connected to both a second end of the primary coil L1 and a second end of the secondary coil L2 are provided. The ground terminal GND is an example of a "common terminal". The phase shifter 12 is configured such that the first terminal T1 and the ground terminal GND of the high-frequency transformer 11 define a first input-output port P1, and the second terminal T2 and the ground terminal GND thereof define a second input-output port P2.

As illustrated in FIG. 9, loop conductor patterns L1A, L1B, L1C, and L1D are provided on base substrates S1, S2, S3, and S5, respectively. Further, loop conductor patterns L2D, L2C, L2B, and L2A are provided on base substrates S4, S6, S7, and S8, respectively.

A first end of the loop conductor pattern L1A defines a first end E11 of the primary coil L1 (the first terminal T1 in the circuit diagram illustrated in FIG. 10). A second end of the loop conductor pattern L1A and a first end of the loop conductor pattern L1B are interlayer-connected with a via conductor V11. A second end of the loop conductor pattern L1B and a first end of the loop conductor pattern L1C are interlayer-connected with a via conductor V12. A second end of the loop conductor pattern L1C and a first end of the loop conductor pattern L1D are interlayer-connected with via conductors V13 and V14. A second end of the loop conductor pattern L1D defines a second end E12 of the primary coil L1.

A first end of the loop conductor pattern L2A defines a first end E21 of the secondary coil L2. A second end of the loop conductor pattern L2A and a first end of the loop conductor pattern L2B are interlayer-connected with a via conductor V21. A second end of the loop conductor pattern L2B and a first end of the loop conductor pattern L2C are interlayer-connected with a via conductor V22. A second end of the loop conductor pattern L2C and a first end of the loop conductor pattern L2D are interlayer-connected with via conductors V23 and V24. A second end of the loop conductor pattern L2D defines a second end E22 of the secondary coil L2 (the second terminal T2 in the circuit diagram illustrated in FIG. 10).

Of the plurality of loop conductor patterns defining the primary coil L1, the loop conductor pattern L1D closest to the second end E12 corresponds to a "first loop conductor pattern". Of the plurality of loop conductor patterns defining the secondary coil L2, the loop conductor pattern L2D closest to the second end E22 corresponds to a "second loop conductor pattern".

Of the plurality of loop conductor patterns defining the primary coil L1, the first loop conductor pattern L1D closest to the second end E12 of the primary coil L1 is located between the layer of the second loop conductor pattern L2D closest to the second end E22 of the secondary coil L2 and the layer of the loop conductor pattern L2C adjacent to the second loop conductor pattern L2D among the plurality of loop conductor patterns defining the secondary coil L2. Further, the second loop conductor pattern L2D is located between the first loop conductor pattern L1D and the loop conductor pattern L1C adjacent to the first loop conductor pattern L1D.

Each of the loop conductor patterns L1A and L1B includes about 1 turn, the loop conductor pattern L1C includes about 1.5 turns, and the first loop conductor pattern L1D includes about 2.5 turns. In addition, each of the loop conductor patterns L2A and L2B includes about 1 turn, the loop conductor pattern L2C includes about 1.5 turns, and the second loop conductor pattern L2D includes about 2.5 turns. That is, among the plurality of loop conductor patterns defining the primary coil L1, the number of turns of the first loop conductor pattern L1D closest to the second end E12 of the primary coil L1 is larger than the average number of turns of other loop conductor patterns (L1A, L1B and L1C) included in the primary coil L1. Similarly, among the plurality of loop conductor patterns defining the secondary coil L2, the number of turns of the second loop conductor pattern L2D closest to the second end E22 of the secondary coil L2 is larger than the average number of turns of other loop conductor patterns (L2A, L2B and L2C) included in the secondary coil L2.

As discussed above, the primary coil L1 and the secondary coil L2 are preferably rectangular or substantially rectangular helical coils each including a plurality of loop conductor patterns provided on a plurality of layers.

In the present preferred embodiment, the lamination order of the plurality of loop conductor patterns defining the primary coil L1 and the lamination order of the plurality of loop conductor patterns defining the secondary coil L2 are opposite to each other in the lamination direction, and the loop conductor patterns of each of the corresponding layers are mirror-symmetrical. Further, the winding direction from the first end E11 to the second end E12 of the primary coil L1 is the same as to the winding direction from the second end E22 to the first end E21 of the secondary coil L2. Therefore, the inductance of the primary coil L1 is equal or substantially equal to the inductance of the secondary coil L2.

A non-limiting example of a manufacturing method for the high-frequency transformer 11 of the present preferred embodiment is described below.

First, metal foil (e.g., copper foil) is laminated on a main surface on one side of each of thermoplastic-resin base substrates S1, S2, S3, S4, S5, S6, S7, and S8 made of liquid crystal polymer or other suitable material in a state of a collective board, and the metal foil is patterned by photolithography to form the loop conductive patterns L1A, L1B, L1C, L1D, L2D, L2C, L2B, L2A, and the like.

Further, via conductors are formed in the resin base substrates S2, S3, S4, S5, S6, S7, and S8 in the collective board state. Each of the via conductors is provided in the following manner: a through-hole is provided using a laser or other suitable device. Thereafter, a conductive paste including at least one of copper, silver, tin, and other suitable material is disposed, and the conductive paste is cured in a heating and pressurizing process to be performed later.

The resin base substrates S1, S2, S3, S4, S5, S6, S7, S8, and S9 are laminated, heated and pressurized so that the conductive paste is solidified. Further, the resin base substrates S1, S2, S3, S4, S5, S6, S7, S8, and S9 are pressure-bonded to form a multilayer body in the collective board state.

Next, the multilayer body in the collective board state is divided to obtain each individual multilayer body 100.

Thereafter, the first terminal T1, the second terminal T2, the ground terminal GND, and the unused terminal NC are formed on a first main surface, a second main surface, and four side surfaces of the multilayer body 100.

According to the present preferred embodiment, the following advantageous effects are obtained.

In the primary coil L1, the second loop conductor pattern L2D is interposed between the layer of the first loop conductor pattern L1D closest to the second end E12 of the primary coil L1 and the layer of the loop conductor pattern L1C adjacent to the first loop conductor pattern L1D, so that the conductor patterns L1D and L1C are distanced in the lamination direction. With this structure, the parasitic capacitance of the primary coil L1 (the capacitance C1$s$ in FIG. 10) is reduced or prevented. Similarly, in the secondary coil L2, the first loop conductor pattern L1D is interposed between the layer of the second loop conductor pattern L2D closest to the second end E22 of the secondary coil L2 and the layer of the loop conductor pattern L2C adjacent to the second loop conductor pattern L2D, so that the conductor patterns L2D and L2C are distanced in the lamination direction. With this structure, the parasitic capacitance of the secondary coil L2 (the capacitance C2$s$ in FIG. 10) is also reduced or prevented. In addition, in the primary coil L1 and the secondary coil L2, the loop conductor patterns with the strongest current intensity (the first loop conductor pattern L1D and the second loop conductor pattern L2D) are close to each other, and moreover, the loop conductor pattern with the strongest current intensity is interposed between the layers of the loop conductor pattern with the strongest current intensity of the partner coil and the loop conductor pattern with the second strongest current intensity of the partner coil. With this structure, the coupling coefficient between the primary coil and the secondary coil is effectively increased. Furthermore, the loop conductor pattern L1C and the first loop conductor pattern L1D, which are the layers on the side closer to the common potential (ground potential) of the primary coil L1, and the loop conductor pattern L2C and the second loop conductor pattern L2D, which are the layers on the side closer to the common potential (ground potential) of the secondary coil L2, are disposed in the order of L1C, L2D, L1D, and L2C, so that the layers of the primary coil L1 and the layers of the secondary coil L2 are alternately disposed in the lamination direction. With this structure, the parasitic capacitance generated between the primary coil L1 and the secondary coil L2 (the capacitance C3$s$ in FIG. 10) is reduced or prevented.

In this manner, the parasitic capacitance C1$s$ of the primary coil L1, the parasitic capacitance C2$s$ of the secondary coil L2, and the parasitic capacitance C3$s$ between the primary coil L1 and the secondary coil L2 are reduced or prevented, and the coupling coefficient between the primary coil L1 and the secondary coil L2 is increased, such that frequency characteristics of the impedance seen from the two ports are stabilized. Further, the amount of phase shift is stabilized over a wide band when used as a phase shifter The number of turns of the first loop conductor pattern L1D is larger than the average number of turns of other loop conductor patterns L1A, L1B and L1C included in the primary coil L1, and the number of turns of the second loop conductor pattern L2D is larger than the average number of turns of other loop conductor patterns L2A, L2B and L2C included in the secondary coil L2. Accordingly, among the loop conductor patterns in the primary coil L1 and the secondary coil L2, the magnetic field coupling between the loop conductor patterns with strong current intensity becomes strong so that the coupling coefficient is effectively increased.

Since the number of turns of the first loop conductor pattern L1D and the number of turns of the second loop conductor pattern L2D are equal or substantially equal to each other, the coupling coefficient between the first loop conductor pattern L1D with strong current intensity and the second loop conductor pattern L2D with strong current intensity is effectively increased, and the coupling coefficient between the primary coil and the secondary coil is further increased.

Since the loop conductor patterns located in the respective layers of the plurality of loop conductor patterns are provided on the corresponding nonmagnetic base substrates (S1 to S9), they are not harmfully affected by frequency characteristics of the magnetic permeability of the magnetic material. Further, no magnetic body loss due to the magnetic material is generated.

In a plan view along the coil winding axis, since the circling positions of the plurality of loop conductor patterns of the primary coil L1 and the circling positions of the plurality of loop conductor patterns of the secondary coil L2 overlap each other, a high coupling coefficient between the primary coil L1 and the secondary coil L2 is obtained.

Since the inductance of the primary coil L1 and the inductance of the secondary coil L2 are equal or substantially equal, the high-frequency transformer is more suitable for use as a phase shifter while maintaining a constant impedance conversion ratio.

In the preferred embodiment described above, a case in which, among the plurality of loop conductor patterns defining the primary coil L1, the number of turns of the first loop conductor pattern L1D closest to the second end E12 of the primary coil L1 is about 2.5, and the number of turns of the loop conductor pattern L1C following the first loop conductor pattern L1D is about 1.5 is exemplified. However, the number of turns of the "other loop conductor patterns" L1A, L1B, and L1C may be the same or substantially the same. This also applies to the secondary coil L2. However, in order to increase the self-inductance of the primary coil L1 or to increase the coupling coefficient between the primary coil L1 and the secondary coil L2, it is preferable that the number of turns of the first loop conductor pattern L1D be larger than any of the numbers of turns of other loop conductor patterns L1A, L1B, and L1C included in the primary coil L1. Similarly, it is preferable that the number of turns of the second loop conductor pattern L2D be larger than any of the numbers of turns of other loop conductor patterns L2A, L2B, and L2C included in the secondary coil L2.

Meanwhile, in the examples discussed above, exemplified is a case in which the number of turns of the first loop conductor pattern L1D is larger than the average number of turns of other loop conductor patterns and the number of turns of the second loop conductor pattern L2D is larger than the average number of turns of other loop conductor patterns. However, it may be configured so that only one of the primary coil or the secondary coil satisfies the above-mentioned condition.

Moreover, in the preferred embodiment described above, a case in which the number of turns of the first loop conductor pattern L1D is equal to the number of turns of the second loop conductor pattern L2D is exemplified. Although it is preferable that these two loop conductor patterns have the same number of turns, it is sufficient that the stated two loop conductor patterns have substantially the same number of turns. Further, the numbers of turns of the two loop conductor patterns may be different from each other.

Further, in the preferred embodiment described above, although a case in which the line widths of the loop conductor patterns L1A, L1B, L1C, L1D, L2D, L2C, L2B, and L2A on the respective layers are equal or substantially equal to each other is exemplified, the widths may be different from each other. In particular, in the case in which the line width of the first loop conductor pattern L1D is larger than the average line width of other loop conductor patterns L1B, L1C, and L1D, the conductor loss in the first loop conductor pattern L1D with strong current intensity is reduced, and the direct-current resistance (DCR) of the primary coil L1 is decreased. Similarly, in the case in which the line width of the second loop conductor pattern L2D is larger than the average line width of other loop conductor patterns L2C, L2B, and L2A, the conductor loss in the second loop conductor pattern L2D with strong current intensity is reduced, and the direct-current resistance (DCR) of the secondary coil L2 is decreased.

In addition, in the preferred embodiment described above, a case in which the circling positions of the plurality of loop conductor patterns of the primary coil L1 and the circling positions of the plurality of loop conductor patterns of the secondary coil L2 overlap each other over the whole circumference in a plan view along the coil winding axis AX is exemplified. However, the circling positions of the plurality of loop conductor patterns of the primary coil L1 and the circling positions of the plurality of loop conductor patterns of the secondary coil L2 may be shifted within an allowable range of a decrease in the coupling coefficient between the primary coil L1 and the secondary coil L2.

Further, in the preferred embodiment described above, although a case in which the interlayer distances between the loop conductor patterns L1A, L1B, L1C, L2D, L1D, L2C, L2B, and L2A of the respective layers are equal or substantially equal is exemplified, the above-described distances may be different from each other. In particular, in the case in which the interlayer distances between the loop conductor patterns L1C, L2D, L1D, and L2C are shorter than the interlayer distances with regard to other loop conductor patterns, the loop conductor patterns L1C, L2D, L1D and L2C with strong current intensity are close to each other, and the coupling coefficient between the primary coil L1 and the secondary coil L2 is increased.

In addition, in the above-described preferred embodiment, a case in which the loop conductor pattern of each layer is mirror-symmetrical with the corresponding loop conductor pattern is exemplified. However, the loop conductor pattern of each layer may not be mirror-symmetrical. Further, the inductance of the primary coil L1 may be different from the inductance of the secondary coil L2.

Third Preferred Embodiment

In a third preferred embodiment of the present invention, a multiplexer including a plurality of SAW filters and a plurality of phase shifters along with these SAW filters will be described.

Figure 11:
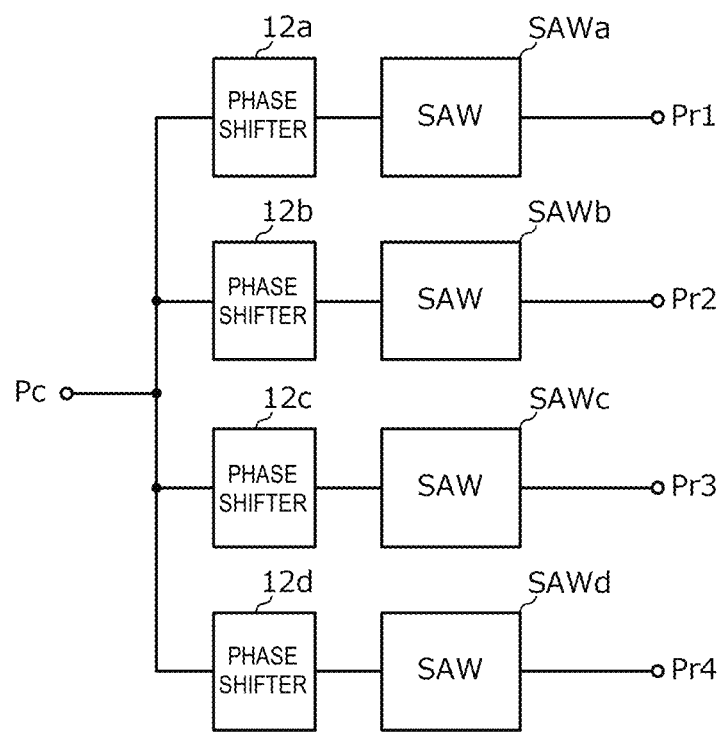
FIG. 11 is a circuit diagram illustrating a configuration of a multiplexer 13 according to a third preferred embodiment of the present invention.

FIG. 11 is a circuit diagram illustrating a configuration of a multiplexer 13 according to the third preferred embodiment. The multiplexer 13 includes phase shifters 12a, 12b, 12c and 12d, and SAW filters SAWa, SAWb, SAWc and SAWd, the phase shifters and the SAW filters being connected between a common port Pc and individual ports Pr1, Pr2, Pr3 and Pr 4, respectively. Each of the phase shifters 12a, 12b, 12c, and 12d is the phase shifter described in the first preferred embodiment. In the present preferred embodiment, for example, an antenna is connected to the common port Pc, and communication circuits of respective frequency bands are connected to the individual ports Pr1, Pr2, Pr3, and Pr4.

Each of the SAW filters SAWa, SAWb, SAWc, and SAWd includes a first port and a second port, and has a different pass frequency band from each other. The first port of the first SAW filter SAWa is connected to the common port Pc via the phase shifter 12a, and the second port thereof is connected to the individual port Pr1. Similarly, the first port of the second SAW filter SAWb is connected to the common port Pc via the phase shifter 12b, and the second port thereof is connected to the individual port Pr2; the first port of the third SAW filter SAWc is connected to the common port Pc via the phase shifter 12c, and the second port thereof is connected to the individual port Pr3; and the first port of the fourth SAW filter SAWd is connected to the common port Pc via the phase shifter 12d, and the second port thereof is connected to the individual port Pr4.

For example, the center frequency of a pass band of the first SAW filter SAWa is preferably about 700 MHz, the center frequency of a pass band of the second SAW filter SAWb is preferably about 800 MHz, and the center frequency of a pass band of the third SAW filter SAWc is preferably about 900 MHz. The center frequency of a pass band of the fourth SAW filter SAWd is preferably about 2 GHz. In other words, the SAW filters SAWa, SAWb, and SAWc are used for low bands, while the SAW filter SAWd is used for a high band.

When seen from the common port Pc, the phase shifter 12a performs phase shifting such that the first SAW filter SAWa is substantially open in the pass frequency bands of the SAW filters SAWb, SAWc, and SAWd. Further, when seen from the common port Pc, the phase shifter 12b performs phase shifting such that the second SAW filter SAWb is substantially open in the pass frequency bands of the SAW filters SAWa, SAWc, and SAWd. When seen from the common port Pc, the phase shifter 12c performs phase shifting such that the third SAW filter SAWc is substantially open in the pass frequency bands of the SAW filters SAWa, SAWb, and SAWd. Likewise, when seen from the common port Pc, the phase shifter 12d performs phase shifting such that the fourth SAW filter SAWd is substantially open in the pass frequency bands of the SAW filters SAWa, SAWb, and SAWc.

Figure 12:
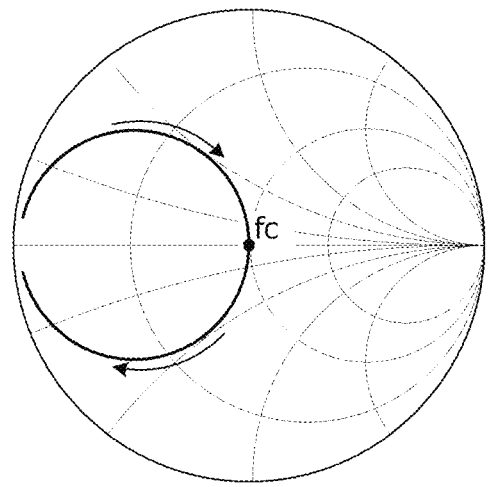
FIG. 12 is a diagram showing, on a Smith chart, frequency characteristics of a reflection coefficient of a general SAW filter when seen from one port thereof.

FIG. 12 is a diagram showing, on a Smith chart, frequency characteristics of a reflection coefficient of a general SAW filter when seen from one port thereof. The impedance is substantially short in a frequency band lower than the pass band, takes a value of prescribed impedance (about 50 S2) at a center frequency fc of the pass frequency band, and is substantially short again in a frequency band higher than the pass band.

Therefore, in a case in which a plurality of SAW filters whose pass band frequencies are largely different are directly connected to the common port, a situation occurs in which the common port Pc is substantially short-circuited to the ground in the frequency band in use. Because of this, the low-band SAW filter and the high-band SAW filter appear short-circuited to each other, for example. Therefore, they cannot be directly connected to the common port Pc.

According to the present preferred embodiment, even if the SAW filters have largely separated pass frequency bands from each other, the stated SAW filters appear open to each other because the phases are shifted by about 180 degrees in the phase shifters. Thus, the stated SAW filters are able to be directly connected to the common port Pc via the phase shifters. In this state, isolation between the ports is secured.

In the first preferred embodiment, the loop conductor patterns made of metal foil are provided on the resin base substrates. However, loop conductor patterns made of copper paste may be formed by printing on low-temperature co-fired ceramics green sheets, laminated, and then formed by integral co-firing, for example. That is, the loop conductor patterns may be defined by an LTCC multilayer substrate.

Although, in each of the above-described preferred embodiments, the example in which the high-frequency transformer is used in a high frequency band of equal to or higher than about 700 MHz is described, the high-frequency transformer may be used in the UHF band or in a higher frequency band than the UHF band. In addition, in a case in which the base substrate is a magnetic ferrite, it is also possible to define a high-frequency transformer that is able to be used in the HF band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency transformer comprising:
a primary coil and a secondary coil coupled to each other by magnetic field coupling and having a same or substantially a same coil winding axis;
a first terminal connected to a first end of the primary coil;
a second terminal connected to a first end of the secondary coil; and
a common terminal connected to both of a second end of the primary coil and a second end of the secondary coil; wherein
each of the primary coil and the secondary coil is a helical coil including a plurality of loop conductor patterns;
each of the plurality of loop conductor patterns is provided on a layer;
the primary coil includes a first loop conductor pattern closest to the second end of the primary coil among the plurality of loop conductor patterns of the primary coil;
the secondary coil includes a second loop conductor pattern closest to the second end of the secondary coil among the plurality of loop conductor patterns of the secondary coil; and
a number of turns of the first loop conductor pattern is larger than an average number of turns of other loop conductor patterns included in the primary coil.

2. The high-frequency transformer according to claim 1, wherein a number of turns of the second loop conductor pattern is larger than an average number of turns of other loop conductor patterns included in the secondary coil.

3. The high-frequency transformer according to claim 2, wherein the number of turns of the first loop conductor pattern is equal or substantially equal to the number of turns of the second loop conductor pattern.

4. The high-frequency transformer according to claim 1, wherein a line width of the first loop conductor pattern is larger than an average line width of the other loop conductor patterns included in the primary coil.

5. The high-frequency transformer according to claim 1, wherein a line width of the second loop conductor pattern is larger than an average line width of other loop conductor patterns included in the secondary coil.

6. The high-frequency transformer according to claim 1, wherein each loop conductor pattern located in each layer of the plurality of loop conductor patterns is provided on a nonmagnetic base substrate.

7. The high-frequency transformer according to claim 1, wherein, in a plan view along the coil winding axis, the plurality of loop conductor patterns of the primary coil and the plurality of loop conductor patterns of the secondary coil overlap each other.

8. The high-frequency transformer according to claim 1, wherein an interlayer distance between the first loop conductor pattern and the second loop conductor pattern is shorter than an interlayer distance between other loop conductor patterns included in the primary coil, or than an interlayer distance between other loop conductor patterns included in the secondary coil.

9. The high-frequency transformer according to claim 1, wherein an inductance of the primary coil and an inductance of the secondary coil are equal or substantially equal.

10. A phase shifter comprising:
   the high-frequency transformer according to claim 1; wherein
   the first terminal and the common terminal define a first input-output port, and the second terminal and the common terminal define a second input-output port.

* * * * *